United States Patent
Ichikawa et al.

(10) Patent No.: US 9,000,621 B2
(45) Date of Patent: Apr. 7, 2015

(54) POWER TRANSMITTING DEVICE, POWER RECEIVING DEVICE, AND POWER TRANSMISSION SYSTEM

(75) Inventors: Keiichi Ichikawa, Nagaokakyo (JP); Henri Bondar, Kyoto (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/493,164

(22) Filed: Jun. 11, 2012

(65) Prior Publication Data
US 2012/0286583 A1    Nov. 15, 2012

Related U.S. Application Data

(63) Continuation of application No. PCT/JP2011/002664, filed on May 13, 2011.

(51) Int. Cl.
  *H01F 38/00*    (2006.01)
  *H01L 41/107*   (2006.01)
  *H02J 5/00*     (2006.01)

(52) U.S. Cl.
  CPC ............ *H01L 41/107* (2013.01); *H02J 5/005* (2013.01)

(58) Field of Classification Search
  USPC ......................... 307/104, 149, 151; 320/108
  See application file for complete search history.

(56) References Cited

U.S. PATENT DOCUMENTS

| | | | | |
|---|---|---|---|---|
| 6,013,969 | A * | 1/2000 | Noma et al. | 310/318 |
| 6,093,997 | A * | 7/2000 | Zimnicki et al. | 310/352 |
| 6,144,139 | A * | 11/2000 | Noma et al. | 310/316.01 |
| 6,359,369 | B1 | 3/2002 | Iino et al. | |
| 6,635,818 | B2 | 10/2003 | Ichiki et al. | |
| 6,894,616 | B1 | 5/2005 | Forster | |
| 8,531,059 | B2 * | 9/2013 | Ichikawa et al. | 307/104 |
| 8,536,739 | B2 * | 9/2013 | Ichikawa et al. | 307/104 |
| 2002/0140375 | A1 * | 10/2002 | Kim et al. | 315/247 |
| 2004/0215243 | A1 * | 10/2004 | Houben et al. | 607/5 |

(Continued)

FOREIGN PATENT DOCUMENTS

| | | |
|---|---|---|
| CN | 1250348 A | 4/2000 |
| CN | 1377466 A | 10/2002 |

(Continued)

OTHER PUBLICATIONS

PCT/JP2011/002664 International Search Report, mailed Aug. 9, 2011.

(Continued)

*Primary Examiner* — Jared Fureman
*Assistant Examiner* — Alfonso Perez Borroto
(74) *Attorney, Agent, or Firm* — Dickstein Shapiro LLP

(57) ABSTRACT

A power transmission system that includes a power transmitting device and a power receiving device. The power transmitting device includes a high-frequency voltage generator, a piezoelectric resonator, a power transmitting device side passive electrode, and a power transmitting device side active electrode. The power receiving device includes a piezoelectric resonator, a load, a power receiving device side passive electrode, and a power receiving device side active electrode. The active electrode of the power transmitting device and the active electrode of the power receiving device are in proximity with each other, whereby the power transmitting device and the power receiving device are capacitively coupled through the active electrodes and the surrounding dielectric medium.

9 Claims, 11 Drawing Sheets

(56) References Cited

U.S. PATENT DOCUMENTS

| | | | |
|---|---|---|---|
| 2009/0206675 A1* | 8/2009 | Camurati et al. | 307/104 |
| 2010/0253441 A1* | 10/2010 | Huang | 331/155 |
| 2011/0051466 A1* | 3/2011 | Kosaka | 363/21.02 |
| 2011/0234019 A1 | 9/2011 | Camurati et al. | |

FOREIGN PATENT DOCUMENTS

| | | |
|---|---|---|
| CN | 101904096 A | 12/2010 |
| EP | 1039558 A1 | 9/2000 |
| JP | 2002-078360 A | 3/2002 |
| JP | 2002-344349 A | 11/2002 |
| JP | 2005-130209 A | 5/2005 |
| JP | 2009-531009 A | 8/2009 |
| JP | 2010-537613 | 12/2010 |

OTHER PUBLICATIONS

European Search Report issued in application No./patent No. 11854541—15556/2707939, PCT/JP2011/002664 mailed on Jan. 13, 2015.

* cited by examiner

POWER TRANSMITTING DEVICE, POWER RECEIVING DEVICE, AND POWER TRANSMISSION SYSTEM

CROSS REFERENCE TO RELATED APPLICATIONS

The present application is a continuation of International application No. PCT/JP2011/002664, filed May 13, 2011, the entire content of which is incorporated herein by reference.

FIELD OF THE INVENTION

The present invention relates to power transmitting devices, power receiving devices, and power transmission systems which transmit electric power in a noncontact manner.

BACKGROUND OF THE INVENTION

PTL 1 discloses a system configured to transmit electric power through capacitive coupling.

The power transmission system described in PTL 1 includes: a power transmitting device including a high-frequency high-voltage generator, generating electrodes to define the couple of generator active/passive electrodes; a power receiving device including a high-frequency high-voltage load, and electromotive electrodes to define the load side active/passive pair.

A voltage lower than that applied to the active electrode is applied to the passive electrode among the generating electrodes, and a voltage lower than that applied to the active electrode is applied to the passive electrode among the electromotive electrodes.

The high-frequency voltage used in this system has a frequency ranging from 10 kHz to 10 MHz and a voltage ranging from 100 V to 10 kV. When the frequency of the high-frequency voltage is within this range, the device does not radiate energy in the form of electromagnetic waves, and an electrostatic field is generated in a surrounding medium because the wavelength (lambda) in the surrounding medium is large enough relative to the size D of the device, or D<< (lambda).

FIG. 1 illustrates the basic configuration of the power transmission system of PTL 1. The power transmitting device includes a high-frequency high-voltage generator 1, a passive electrode 2, and an active electrode 3. The power receiving device includes a high-frequency high-voltage load 5, a passive electrode 7, and an active electrode 6. The active electrode 3 of the power transmitting device and the active electrode 6 of the power receiving device are located in proximity to each other and are surrounded by a high electric field area 4 the power transmitting device and the power receiving device are capacitively coupled through the generating and electromotive electrodes and the surrounding dielectric medium.

[PTL 1] National Publication of International Patent Application No. 2009-531009

SUMMARY OF THE INVENTION

In a power transmission system, such as the one described in PTL 1, configured to transmit electric power through capacitive coupling from a power transmitting device to a power receiving device, a high voltage at high frequency is required to increase power transmission efficiency. Hence, a step-up circuit is provided on the power transmitting device side and a step-down circuit is provided on the power receiving device side. Usually, wire-wound transformers are used as the step-up circuit and step-down circuit, and the electrode's structure leads to an equivalent capacitor connected in parallel with the secondary winding of the wire-wound transformer. In this configuration, a circuit formed of the capacitance of the resonant capacitor and the leakage inductance on the secondary side of the wire-wound transformer resonates and functions as a step-up circuit.

However, a wire-wound transformer has a size large enough to provide the required inductance, and hence it is difficult to decrease its height. It can be said that a wire-wound transformer has a very large size compared with other general electronic components. In addition, undesirable coupling between the wire-wound transformer and other circuits is likely to be generated. In the case of a resonant leakage wire-wound transformer in particular, there is a large amount of leakage magnetic flux. These factors result in a restricted arrangement of the wire-wound transformer and an increased size of the whole device.

Further, when the wire-wound transformer is not efficiently shielded, the coil performance (Q factor) thereof is strongly affected by the nearby conductive materials.

Accordingly, it is an object of the present invention to provide a power transmitting device, a power receiving device, and a power transmission system which are small and lightweight, avoiding the above-described problems caused by the use of a wire-wound transformer.

A power transmitting device according to the present invention is configured to include: a power transmitting device side active electrode; a power transmitting device side passive electrode; and a high-frequency high-voltage generating circuit connected between the power transmitting device side active electrode and the power transmitting side passive electrode. The high-frequency high-voltage generating circuit includes a step-up circuit having an LC resonant circuit, and an inductor of the LC resonant circuit is formed of a piezoelectric device.

A power receiving device according to the present invention is configured to include: a power receiving device side active electrode; a power receiving device side passive electrode; and a load circuit connected between the power receiving device side active electrode and the power receiving side passive electrode. The load circuit includes a step-down circuit having an LC resonant circuit, and an inductor of the LC resonant circuit is formed of a piezoelectric device.

A power transmission system according to the present invention is configured such that the power transmitting device and the power receiving device are capacitively coupled through the generating and electromotive electrodes and the surrounding dielectric medium.

According to the present invention, the whole device is reduced in size and leakage of magnetic flux is prevented. In addition, transmission efficiency is increased.

DETAILED DESCRIPTION OF THE PREFERRED EMBODIMENTS

First Embodiment

A power transmitting device according to a first embodiment will be described with reference to FIGS. 2A to 2C and FIG. 3.

Figure 1:
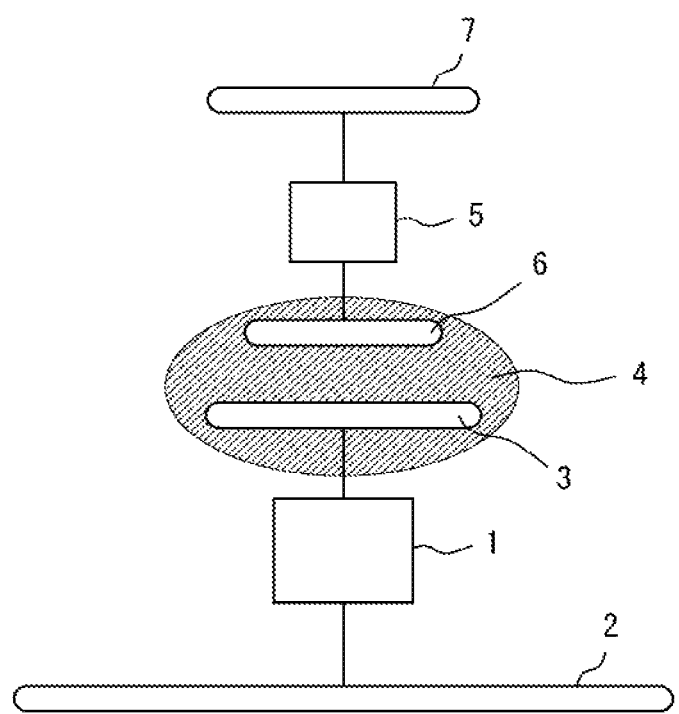
FIG. 1 illustrates the basic configuration of the power transmission system described in PTL 1.
Figure 2A:
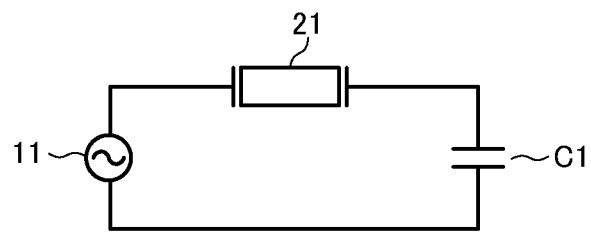
FIG. 2A is a circuit diagram of a uncoupled power transmitting device 101 according to a first embodiment.

FIG. 2A is a circuit diagram of a uncoupled power transmitting device 101 according to the first embodiment. The power transmitting device 101 includes a high-frequency voltage generator 11, and a piezoelectric resonator 21. The equivalent capacitor C1 represents the capacitance obtained between the two generating electrodes when no receiving device is present. The piezoelectric resonator 21 and the capacitor C1 are connected in series to the high-frequency voltage generator 11.

Figure 2B:
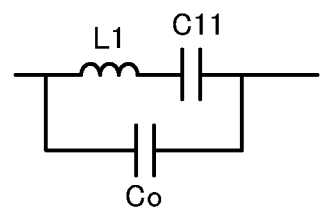
FIG. 2B is an equivalent circuit of a piezoelectric resonator 21.
Figure 3:
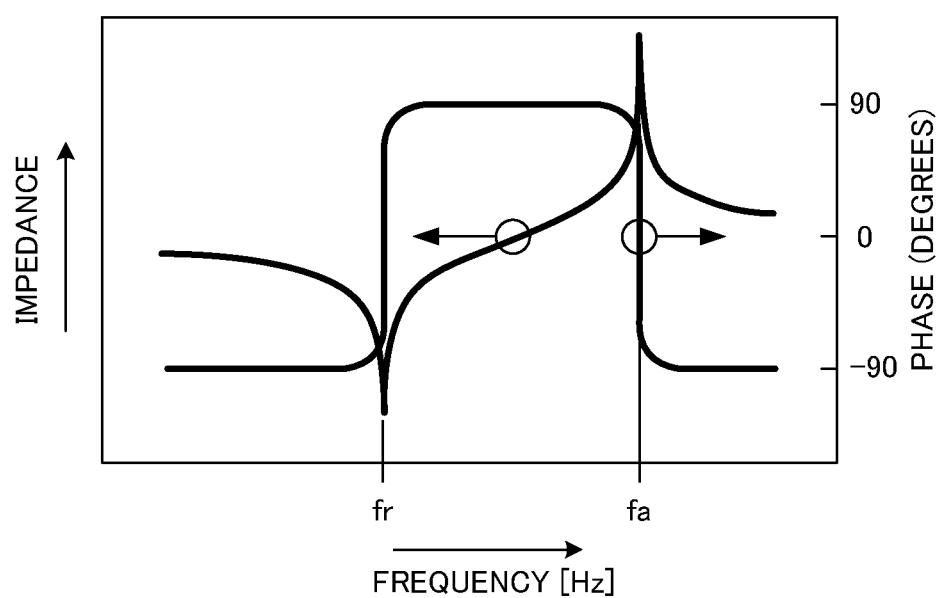
FIG. 3 is a graph illustrating the frequency characteristics of the impedance and phase of the piezoelectric resonator 21.

FIG. 2B is an equivalent circuit of the piezoelectric resonator 21. FIG. 3 is a graph illustrating the frequency characteristics of the impedance and phase of the piezoelectric resonator 21. In FIG. 3, a logarithmic scale is used for the impedance axis (vertical axis), and a linear scale is used for the frequency axis (horizontal axis). The piezoelectric resonator 21 is represented by a parallel circuit formed of a capacitor Co and a series circuit formed of an inductor L1 and a capacitor C11. The capacitor C11 represents equivalent compliance corresponding to the elastic force of a mechanical spring or rubber. The inductor L1 represents equivalent inductance corresponding to mechanical inertial force (mass or moment). The capacitor Co corresponds to the capacitance (parallel equivalent capacitance) between electrodes. The piezoelectric resonator 21 is formed of a pair of electrodes formed on the surface of a piezoelectric substrate. The piezoelectric substrate has been subjected to poling treatment. Hence, in the piezoelectric resonator 21, series resonance having a resonant frequency fr based on the inductor L1 and the capacitor C11 is generated, and parallel resonance having an anti-resonant frequency fa mainly based on the capacitor Co and the inductor L1 is generated. The anti-resonant frequency fa is higher than the resonant frequency fr. In the frequency range between the resonant frequency fr and the anti-resonant frequency fa, the inductance of the inductor L1 becomes the dominant component of the impedance of the piezoelectric resonator 21. In other words, referring to FIG. 3, the piezoelectric resonator 21 has inductive impedance, for which the phase is positive, in the frequency range between the resonant frequency fr and the anti-resonant frequency fa, and equivalently works as an inductor. For frequencies below the resonant frequency fr or above the anti-resonant frequency fa, the piezoelectric resonator 21 has capacitive impedance, for which the phase is negative, and equivalently works as a capacitor.

Figure 2C:
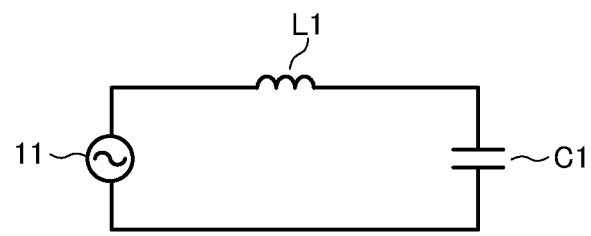
FIG. 2C is an equivalent circuit of the power transmitting device 101 according to the first embodiment for the case where the frequency of a voltage generated by a high-frequency voltage generator 11 is a frequency in the frequency range from a resonant frequency fr to an anti-resonant frequency fa.

FIG. 2C is an equivalent circuit of the power transmitting device 101 according to the first embodiment for the case where the frequency of a voltage generated by the high-frequency voltage generator 11 is a frequency in the frequency range from the resonant frequency fr to the anti-resonant frequency fa. The resonant frequency of an LC resonant circuit formed of the capacitor C1 and the inductor L1 is set to be the frequency of the high-frequency voltage generated by the high-frequency voltage generator 11. As a result, the circuit illustrated in FIG. 2C works as a step-up circuit.

According to the power transmitting device of the first embodiment, the device can be reduced in size and leakage of magnetic flux can be reduced, compared with the case in which the inductor L1 illustrated in FIG. 2C is formed of a magnetic core and a winding.

Piezoelectric devices including a piezoelectric resonator have a high Q factor compared with coils of wire. Hence, when a piezoelectric device is used as an inductor, transmission efficiency can be increased.

Second Embodiment

Figure 4A:
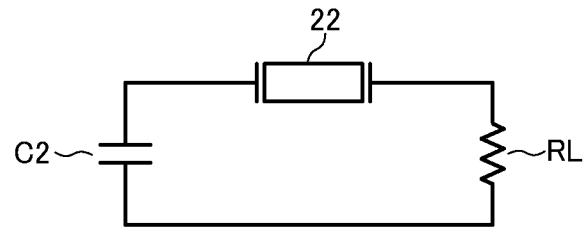
FIG. 4A is a circuit diagram of a uncoupled power receiving device 201 according to a second embodiment.

FIG. 4A is a circuit diagram of an uncoupled power receiving device 201 according to a second embodiment. The power receiving device 201 includes a piezoelectric resonator 22, and a load RL. The equivalent capacitor C2 represents the capacitance obtained between the two electromotive electrodes when no power transmitting device is present. The piezoelectric resonator 22 and the load RL is connected in series to the capacitor C2.

Figure 4B:
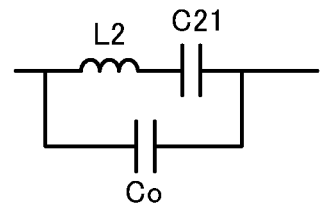
FIG. 4B is an equivalent circuit of a piezoelectric resonator 22.

FIG. 4B is an equivalent circuit of the piezoelectric resonator 22. As illustrated in FIG. 4B, the piezoelectric resonator 22 is represented by a parallel circuit formed of a capacitor Co and a series circuit formed of an inductor L2 and a capacitor C21. This equivalent circuit is similar to the one illustrated in FIG. 2B in the first embodiment, and has frequency characteristics similar to those illustrated in FIG. 3.

Figure 4C:
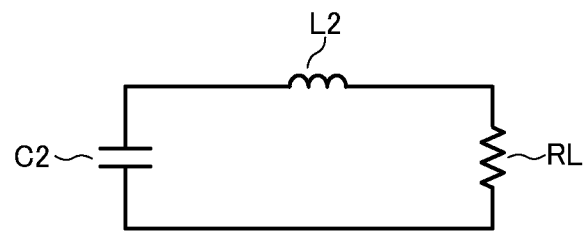
FIG. 4C is an equivalent circuit of the power receiving device 201 according to the second embodiment for the case where the frequency of a voltage received through the capacitive coupling of a capacitor C2 is a frequency in the frequency range from the resonant frequency fr to the anti-resonant frequency fa illustrated in FIG. 3.

FIG. 4C is an equivalent circuit of the power receiving device 201 according to the second embodiment for the case where the frequency of a voltage received through a capacitive coupling involving C2 is a frequency in the frequency range from the resonant frequency fr to the anti-resonant frequency fa illustrated in FIG. 3. The resonant frequency of an LC resonant circuit formed of the inductor L2 and the capacitor C2 is equal to the frequency of the voltage received through the capacitive coupling. The circuit illustrated in FIG. 4C works as a step-down circuit when coupled to a power transmitting device.

According to the power receiving device of the second embodiment, the device can be reduced in size and leakage of magnetic flux can be reduced, compared with the case in which the inductor L2 illustrated in FIG. 4C is formed of a magnetic core and a winding.

Third Embodiment

All the electrodes are interacting through a dielectric medium (including air and vacuum). The quasi static-situation (negligible far field radiation) in case of four electrodes (one generator, one load), is fully described by a 4×4 matrix involving 10 different capacitive coefficients. In case of a two port representation of the system, the power transfer is fully described in the classical circuit frame by two coupled equivalent capacitors C1 and C2 and a mutual capacitance CM or equivalently a coupling factor k. These values can be derived from the 10 independent general coefficients of the original matrix and will be referred in the following as the two-port three-coefficient coupling model.

In some practical situations the behavior is dominated by some specific coefficients among the many involved, for instance the coupling coefficients between on one hand the active electrodes and on the other hand the passive ones.

Figure 5:
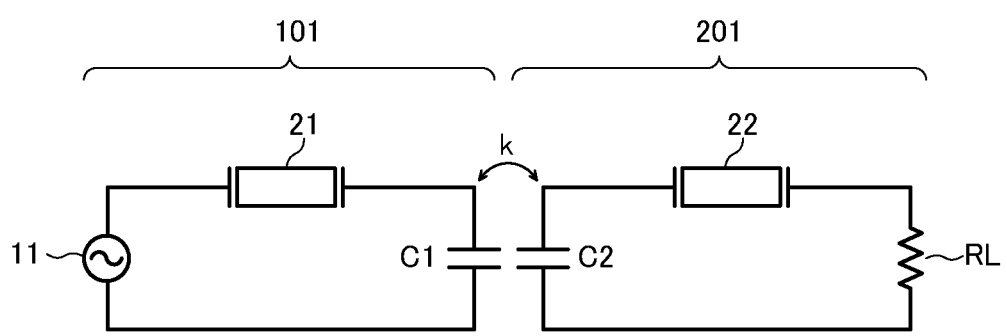
FIG. 5 is a circuit diagram of a power transmission system 301 according to a third embodiment. The coupling coefficient k and the two capacitances C1 and C2 are a representation of the resulting electrostatic coupling between the system of electrodes.

FIG. 5 is a circuit diagram of a power transmission system 301 according to a third embodiment. The power transmission system 301 is formed of the power transmitting device 101 described in the first embodiment and the power receiving device 201 described in the second embodiment. The capacitor C1 of the power transmitting device 101 is coupled to the capacitor C2 of the power receiving device 201 according to the two port model for energy transport, whereby electric power is transmitted from the power transmitting device 101 to the power receiving device 201 through an electric field.

Here, mutual capacitance CM and a coupling factor k have the following relation.

$$k = CM/\text{SQRT}(C1*C2)$$

Figure 6:
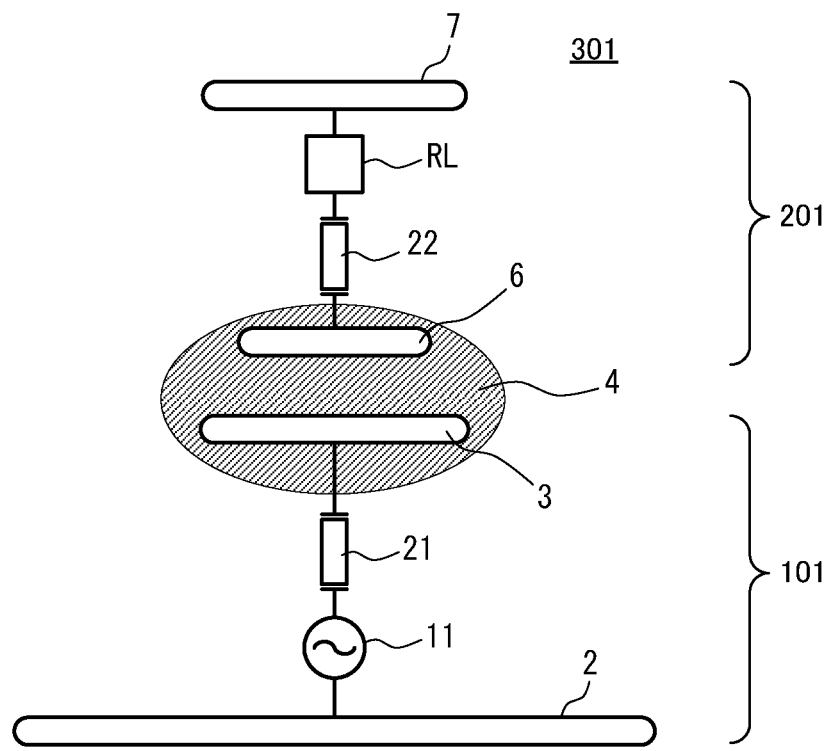
FIG. 6 illustrates an exemplary configuration of the power transmission system 301 with a longitudinal open ends representation.

FIG. 6 illustrates an exemplary configuration of the power transmission system 301 with a longitudinal open ends representation. The power transmitting device 101 includes the high-frequency voltage generator 11, a piezoelectric resonator 21, a power transmitting device side passive electrode 2, and a power transmitting device side active electrode 3. The power receiving device 201 includes a piezoelectric resonator 22, a load RL, a power receiving device side passive electrode 7, and a power receiving device side active electrode 6. The active electrode 3 of the power transmitting device 101 and the active electrode 6 of the power receiving device 201 are located in proximity to each other and are surrounded by a high electric field area 4, the power transmitting device and the power receiving device are capacitively coupled through the generating and electromotive electrodes and the surrounding dielectric medium.

Figure 7:
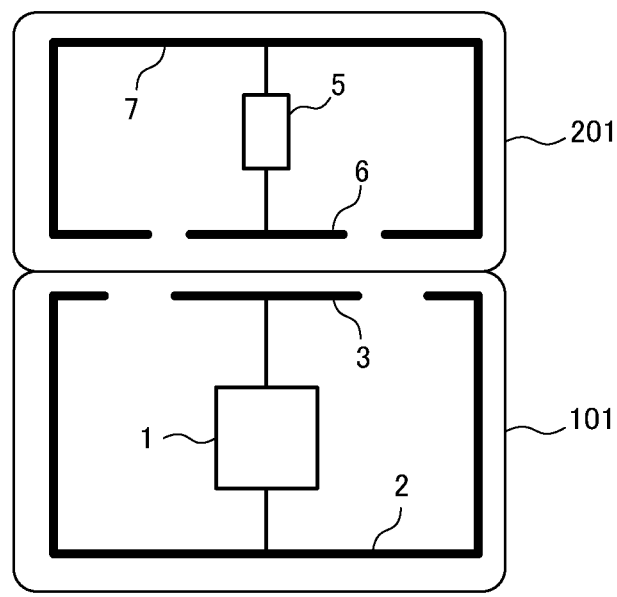
FIG. 7 is a schematic sectional view of the power transmission system 301 according to the third embodiment.

FIG. 7 is a schematic sectional view of the power transmission system 301 according to the third embodiment. In this example, the passive electrode 2 of the power transmitting device 101 faces to some extend the passive electrode 7 of the power receiving device 201. The power transmitting device side active electrode 3 and the transmitting device side passive electrode 2 which surrounds the active electrode 3 in an insulated state are formed near the upper surface of the casing of the power transmitting device 101. In addition, a high-frequency high-voltage generating circuit 1 that applies a high-frequency voltage between the active electrode 3 and the passive electrode 2 is provided within the casing of the power transmitting device 101. The high-frequency high-voltage generating circuit 1 is a circuit formed of the high-frequency voltage generator 11, and the piezoelectric resonator 21.

The casing of the power transmitting device 101 is a single-piece plastic body made of, for example, an ABS resin, formed in such a manner as to integrate the active electrode 3 and the passive electrode 2 therein, whereby the outer surface of the casing has an insulation structure.

A power receiving device side active electrode 6 and the power receiving device side passive electrode 7 which surrounds the active electrode 6 in an insulated state are provided near the lower surface of the casing of the power receiving device 201. In addition, a load circuit 5 for electric power induced between the active electrode 6 and the passive electrode 7 is provided within the casing of the power receiving device 201. The load circuit 5 is a circuit formed of the piezoelectric resonator 22, the wire-wound transformer T2, and the load RL.

The casing of the power receiving device 201 is also a single-piece plastic body made of, for example, an ABS resin, formed in such a manner as to integrate the active electrode 6 and the passive electrode 7 therein, whereby the outer surface of the casing has an insulation structure.

The active electrode 3 of the power transmitting device 101 is shaped like a circle. The passive electrode 2 is provided with a circular opening for the active electrode 3. In other words, the passive electrode 2 is arranged so as to surround the active electrode 3 in an insulated state. Also in the power receiving device 201, the active electrode 6 is shaped like a circle, and the passive electrode 7 is provided with a circular opening for the active electrode 6. The passive electrode 7 is arranged so as to surround the active electrode 6 in an insulated state.

Fourth Embodiment

When a voltage generated by the high-frequency voltage generator 11 is low and there is strong coupling between a power transmitting device and a power receiving device, there may be a case in which a high voltage required for sufficient power transmission is not obtained by stepping up the voltage due to the resonance of the power transmitting device 101 described in the first embodiment. In such a case, a wire-wound transformer T1 may be provided in a stage prior to the piezoelectric resonator of the power transmitting device, thereby increasing a voltage applied to a piezoelectric resonator 21, as in a fourth embodiment described below.

A power transmitting device according to a fourth embodiment will be described with reference to FIGS. 8A to 8C.

Figure 8A:
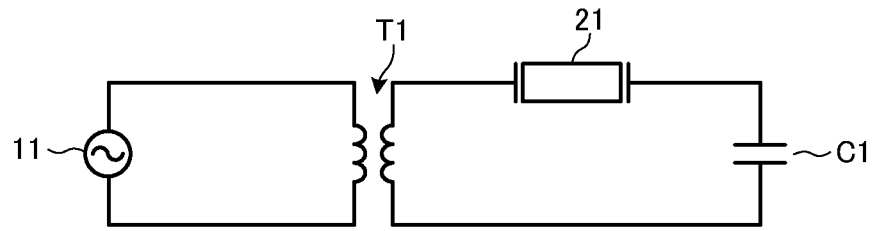
FIG. 8A is a circuit diagram of a power transmitting device 102 according to a fourth embodiment.

FIG. 8A is a circuit diagram of a power transmitting device 102 according to the fourth embodiment. The power transmitting device 102 includes a high-frequency voltage generator 11, a wire-wound transformer T1, a piezoelectric resonator 21, and an equivalent capacitor C1. The high-frequency voltage generator 11 is connected to the primary side of the wire-wound transformer T1, and a series circuit formed of the piezoelectric resonator 21 and the capacitor C1 is connected to the secondary side of the wire-wound transformer T1.

Figure 8B:
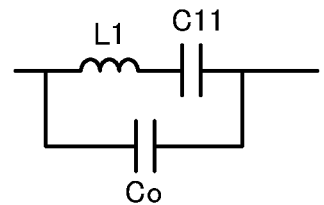
FIG. 8B is an equivalent circuit of a piezoelectric resonator 21.

FIG. 8B is an equivalent circuit of the piezoelectric resonator 21. The piezoelectric resonator 21 is represented by a parallel circuit formed of a capacitor Co and a series circuit formed of an inductor L1 and a capacitor C11. The capacitor C11 represents equivalent compliance corresponding to the elastic force of a mechanical spring or rubber. The inductor L1 represents equivalent inductance corresponding to mechanical inertial force (mass or moment). The capacitor Co corresponds to the capacitance (parallel equivalent capacitance) between electrodes. The piezoelectric resonator 21 is formed of a pair of electrodes formed on the surface of a piezoelectric substrate. The piezoelectric substrate has been subjected to poling treatment. Hence, in the piezoelectric resonator 21, series resonance having a resonant frequency fr based on the inductor L1 and the capacitor C11 is generated, and parallel resonance having an anti-resonant frequency fa mainly based on the capacitor Co and the inductor L1 is generated. The anti-resonant frequency fa is higher than the resonant frequency fr. In the frequency range between the resonant frequency fr and the anti-resonant frequency fa, the inductance of the inductor L1 becomes the dominant component of the impedance of the piezoelectric resonator 21. In other words, referring to FIG. 3, the piezoelectric resonator 21 has inductive impedance, for which the phase is positive, in the frequency range between the resonant frequency fr and the anti-resonant frequency fa, and equivalently works as an inductor. For frequencies below the resonant frequency fr or above the anti-resonant frequency fa, the piezoelectric resonator 21 has capacitive impedance, for which the phase is negative, and equivalently works as a capacitor.

Figure 8C:
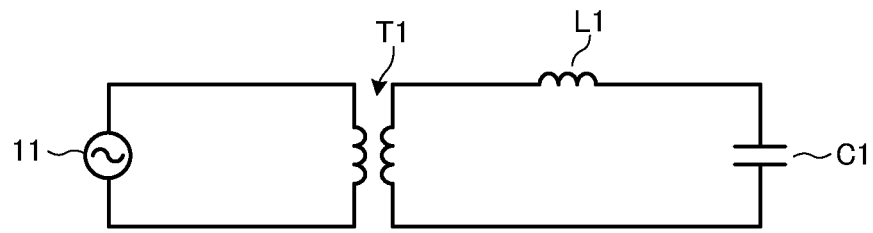
FIG. 8C is an equivalent circuit of the power transmitting device 102 according to the fourth embodiment for the case where the frequency of a voltage generated by a high-frequency voltage generator 11 is a frequency in the frequency range from a resonant frequency fr to an anti-resonant frequency fa.

FIG. 8C is an equivalent circuit of the power transmitting device 102 according to the fourth embodiment for the case where the frequency of a voltage generated by the high-frequency voltage generator 11 is a frequency in the frequency range from the resonant frequency fr to the anti-resonant frequency fa. The resonant frequency of an LC resonant circuit formed of the capacitor C1 and the inductor L1 (to be precise, an LC resonant circuit formed of the capacitance of the capacitor C1 and the combined inductance of the secondary side leakage inductance of the wire-wound transformer T1 and the inductance of the inductor L1) is set to be the frequency of the high-frequency voltage generated by the high-frequency voltage generator 11. As a result, the wire-wound transformer T1 and the LC resonant circuit work as a step-up circuit. The numbers of turns of the primary and secondary windings of the wire-wound transformer T1 are appropriately set so as to realize the step-up ratio required to output a predetermined high voltage to the capacitor C1. For example, the high-frequency voltage generator 11 generates a high-frequency voltage of 5 to 12 V, which is stepped up to 50 to 240 V by the wire-wound transformer T1.

According to the power transmitting device of the fourth embodiment, the device can be reduced in size and leakage of magnetic flux can be reduced, compared with the case in which the inductor L1 illustrated in FIG. 8C is formed of a magnetic core and a winding. In addition, the wire-wound transformer can be reduced in size compared with the case in which the inductor L1 in the equivalent circuit illustrated in FIG. 8C is formed of the secondary side leakage inductance of the wire-wound transformer.

Piezoelectric devices including a piezoelectric resonator have a high Q factor compared with coils of wire. Hence, when a piezoelectric device is used as an inductor, transmission efficiency can be increased.

The wire-wound transformer T1 is preferably a closed magnetic circuit wire-wound transformer such as a shell-type transformer having a magnetic core arranged outside of the windings and generating little leakage of an undesirable magnetic field, to prevent leakage of undesirable magnetic flux.

In addition, the coupling coefficient of the wire-wound transformer T1 is preferably high.

Further, the wire-wound transformer T1 may be omitted when the high-frequency voltage generated by the high-frequency voltage generator 11 is sufficiently high.

Fifth Embodiment

When a voltage generated by a power transmitting device is low and there is strong coupling between a power receiving device and the power transmitting device, there may be a case in which sufficient power transmission is not realized by the voltage step-down due to the resonance of the power receiving device 201 described in the second embodiment. In such a case, a wire-wound transformer T2 may be provided in a stage subsequent to the piezoelectric resonator of the power receiving device, thereby obtaining a predetermined voltage using an appropriate step-down ratio, as in a fifth embodiment described below.

Figure 9A:
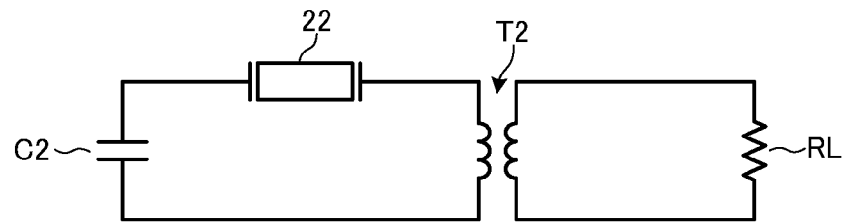
FIG. 9A is a circuit diagram of a power receiving device 202 according to a fifth embodiment.

FIG. 9A is a circuit diagram of a power receiving device 202 according to a fifth embodiment. The power receiving device 202 includes an equivalent capacitor C2, a piezoelectric resonator 22, a wire-wound transformer T2, and a load RL. A series circuit formed of the piezoelectric resonator 22 and the capacitor C2 is connected to the primary side of the wire-wound transformer T2, and the load RL is connected to the secondary side of the wire-wound transformer T2.

Figure 9B:
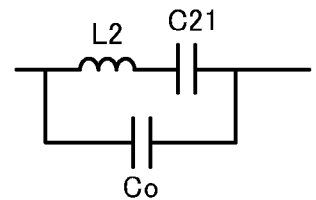
FIG. 9B is an equivalent circuit of a piezoelectric resonator 22.

FIG. 9B is an equivalent circuit of the piezoelectric resonator 22. As illustrated in FIG. 9B, the piezoelectric resonator 22 is represented by a parallel circuit formed of a capacitor Co and a series circuit formed of an inductor L2 and a capacitor C21. This equivalent circuit is similar to the one illustrated in FIG. 2B in the first embodiment, and has frequency characteristics similar to those illustrated in FIG. 3.

Figure 9C:
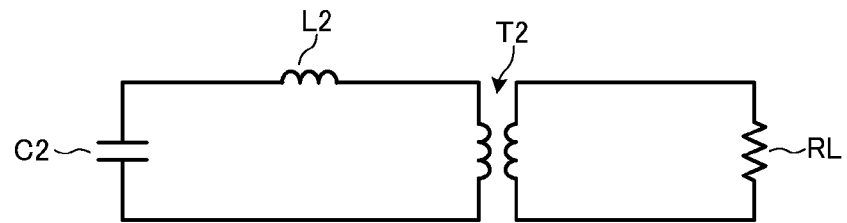
FIG. 9C is an equivalent circuit of the power receiving device 202 according to the fifth embodiment for the case where the frequency of a voltage received through the capacitive coupling of a capacitor C2 is a frequency in the frequency range from the resonant frequency fr to the anti-resonant frequency fa illustrated in FIG. 3.

FIG. 9C is an equivalent circuit of the power receiving device 202 according to the fifth embodiment for the case where the frequency of a voltage received through the capacitive coupling via C2 is a frequency in the frequency range from the resonant frequency fr to the anti-resonant frequency fa illustrated in FIG. 3. The resonant frequency of an LC resonant circuit formed of the inductor L2 and the capacitor C2 (to be precise, an LC resonant circuit formed of the combined inductance of the primary side leakage inductance of the wire-wound transformer T2 and the inductance of the inductor L2 and the capacitance of the capacitor C2) is set to be the frequency of the high-frequency voltage received through the capacitive coupling via C2. As a result, the wire-wound transformer T2 and the LC resonant circuit work as a step-down circuit. The numbers of turns of the primary and secondary windings of the wire-wound transformer T2 are appropriately set so as to realize the step-down ratio required to output a predetermined voltage to the load RL. For example, a high-frequency voltage of 100 V to 3 kV is induced in the capacitor C2, and the wire-wound transformer T2 steps down this voltage to 5 to 24 V.

According to the power receiving device of the fifth embodiment, the device can be reduced in size and leakage of magnetic flux can be reduced, compared with the case in which the inductor L2 illustrated in FIG. 9C is formed of a magnetic core and a winding. In addition, the wire-wound transformer can be reduced in size compared with the case in which the inductor L2 in the equivalent circuit illustrated in FIG. 9C is formed of the primary side leakage inductance of the wire-wound transformer.

The wire-wound transformer T2 is preferably a closed magnetic circuit wire-wound transformer such as an external-magnet transformer having a magnetic core arranged outside of the windings and generating little undesirable magnetic field, to prevent leakage of undesirable magnetic flux.

Sixth Embodiment

Figure 10:
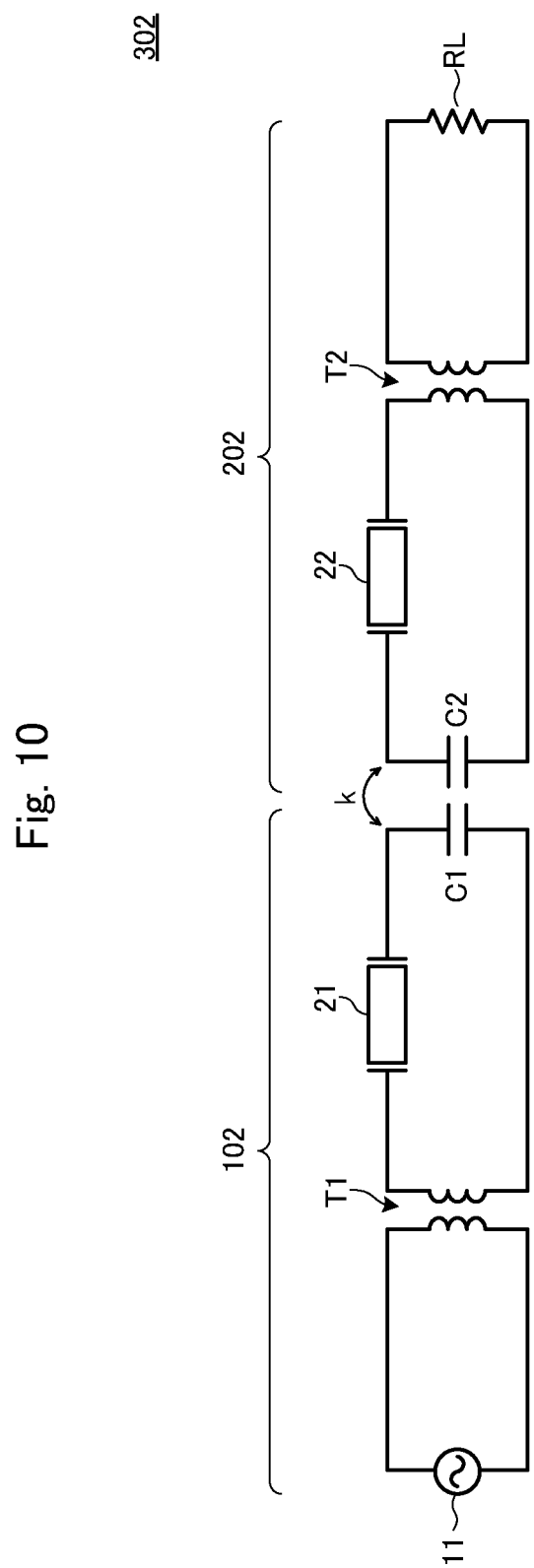
FIG. 10 is a circuit diagram of a power transmission system 302 according to a sixth embodiment.

FIG. 10 is a circuit diagram of a power transmission system 302 according to a sixth embodiment. The power transmission system 302 is formed of the power transmitting device 102 described in the fourth embodiment and the power receiving device 202 described in the fifth embodiment. The capacitor C1 of the power transmitting device, the capacitor C2 of the power receiving device and the coefficient k are the two port representation of the coupling through a quasi-static electric field.

Seventh Embodiment

Figure 11A:
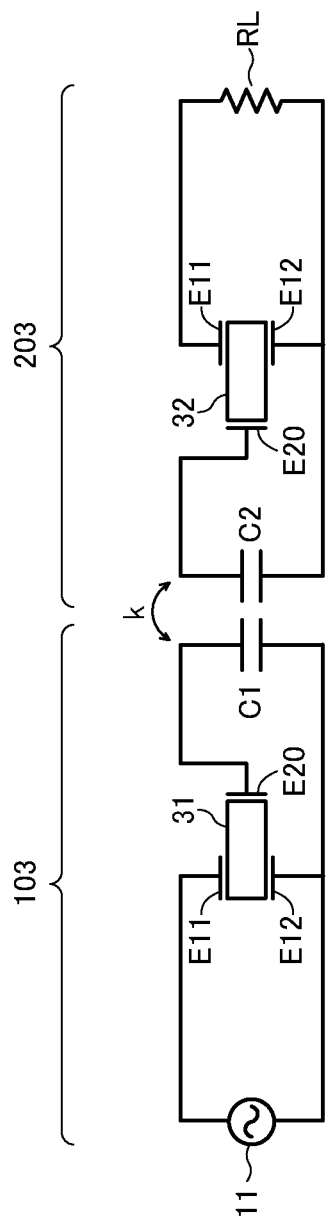
FIG. 11A is a circuit diagram of a power transmission system 303 according to a seventh embodiment.
Figure 11B:
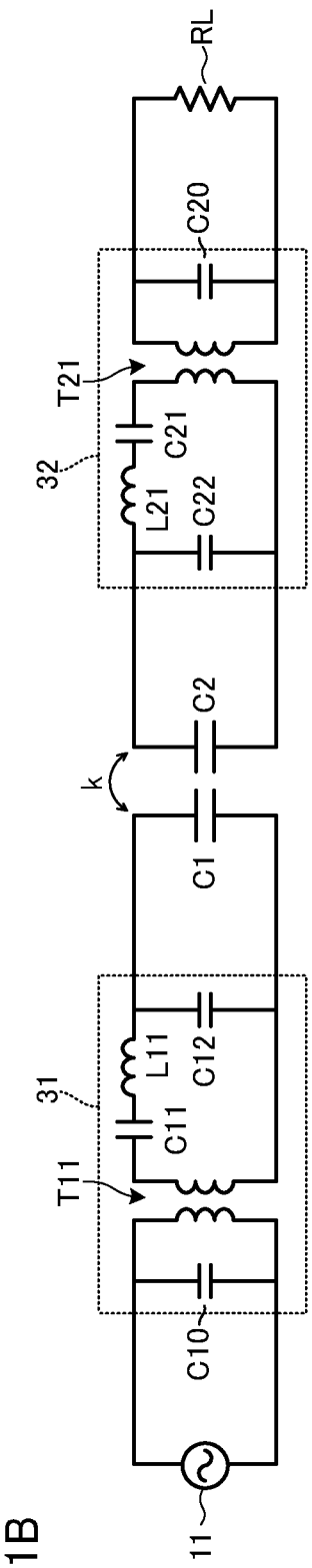
FIG. 11B is its equivalent circuit.

FIG. 11A is a circuit diagram of a power transmission system 303 according to a seventh embodiment, and FIG. 11B is its equivalent circuit. The power transmission system 303 is formed of a power transmitting device 103 and a power receiving device 203.

The power transmitting device 103 is formed of the high-frequency voltage generator 11, a piezoelectric transformer 31, and the coupling capacitor C1. The power receiving device 203 is formed of the coupling capacitor C2, a piezoelectric transformer 32, and the load RL.

In the piezoelectric transformer 31, primary side electrodes E11 and E12 and a secondary side electrode E20 are formed on a piezoelectric ceramic substrate shaped like a rectangular parallelepiped. The primary side of the piezoelectric substrate is poled in a direction from the electrode E11 to the electrode E12. The secondary side of the ceramic substrate is poled in a direction from the electrodes E11 and E12 to an electrode E20. When a high-frequency voltage is applied between the primary side electrodes E11 and E12, the energy is converted into elastic energy due to the primary side inverse piezoelectric effect, and the elastic energy is converted back into electric energy due to the secondary side piezoelectric effect.

As illustrated in FIG. 11B, the equivalent circuit of the piezoelectric transformer 31 includes an ideal transformer T11, capacitors C10, C11, and C12, and an inductor L11. The capacitors C10 and C12 correspond to stray capacitance, and the capacitor C11 and the inductor L11 are electromechanical parameters. The resonant frequency of the piezoelectric transformer 31 is mainly determined by the resonance of a resonance circuit formed of the capacitor C11 and the inductor L11. Since the conversion of electric energy is performed through elastic oscillation, a frequency near the characteristic resonant frequency determined by the elastic wave propagation velocity and dimensions of the piezoelectric ceramic substrate is used. In other words, the frequency of a high-frequency voltage generated by the high-frequency voltage generator 11 is set to be near the resonant frequency of the piezoelectric transformer 31.

The piezoelectric transformer 32 has basically the same configuration as the piezoelectric transformer 31. However, the relationship between the primary and the secondary sides is reversed. That is, energy is input to the piezoelectric transformer 32 from the electrode E20, which is generally on the secondary side, and energy is output from the electrodes E11 and E12, which are generally on the primary side.

As illustrated in FIG. 11B, the equivalent circuit of the piezoelectric transformer 32 includes an ideal transformer T21, capacitors C20, C21, and C22, and an inductor L21. The capacitors C20 and C22 correspond to stray capacitance, and the capacitor C21 and the inductor L21 are electromechanical parameters. The resonant frequency of the piezoelectric transformer 32 is mainly determined by the resonance of a resonance circuit formed of the capacitor C21 and the inductor L21. When a voltage induced in the capacitor C2 is applied to the electrode E20, its energy is converted into elastic energy due to the secondary side inverse piezoelectric effect, and the elastic energy is converted back into electric energy due to the primary side piezoelectric effect. The frequency of a high-frequency voltage generated by the high-frequency voltage generator 11 is set to be the resonant frequency of the piezoelectric transformer 32.

For example, the high-frequency voltage generator 11 generates a high-frequency voltage of 5 to 12 V, and the piezoelectric transformer 31 steps up this voltage to 100 V to 3 kV. The piezoelectric transformer 32 steps down the voltage of 100 V to 3 kV induced in the capacitor C2 to 5 to 12 V, and outputs the stepped-down voltage to the load RL.

In this manner, by using a piezoelectric transformer as a step-up circuit, the power transmitting device can be reduced in size and leakage of magnetic flux can be prevented, compared with the case of using a step-up wire-wound transformer.

In addition, by using a piezoelectric transformer, which is usually used as a step-up transformer, as a step-down transformer in a power receiving device, the power receiving device can be reduced in size and leakage of magnetic flux can be prevented, compared with the case of using a step-down wire-wound transformer.

Eighth Embodiment

The very high internal Q factors of piezoelectric materials (compared with usual coils) imply satisfaction of the conditions for very sharp frequency tuning between the two tuned circuits. When a continuous voltage, in addition to an oscillating voltage, is applied across the primary electrodes, this voltage generates a continuous strain inside the material, allowing the resonant frequency to be slightly changed. Hence, tuning is possible with only a small effect on the Q factor. This tuning technique may be used to adapt the device to various coupling conditions between the power transmitting device and power receiving device. In other embodiments mechanical or purely electrical means, such as adjustable capacitors or inductors, are used.

Other Embodiments

While examples in which the load RL is an AC load have been shown in the embodiments described above, the present invention may be applied to the case of a DC load by providing a rectifying and smoothing circuit.

Wire-wound transformers are used both in the power transmitting device 102 and the power receiving device 202 in the fourth embodiment, and piezoelectric transformers are used both in the power transmitting device 103 and the power receiving device 203 in the fifth embodiment. However, by providing a wire-wound transformer in one of a power transmitting device and a power receiving device, a piezoelectric resonator or a piezoelectric transformer may be provided in the other.

Further, a piezoelectric transformer may be combined with a voltage transforming circuit. For example, in the power transmitting device, when a sufficient step-up ratio is not obtained by a piezoelectric transformer alone, or when a sufficient step-up ratio is not obtained by a wire-wound transformer alone, the piezoelectric transformer may be configured to be driven by a voltage which has been stepped-up by the wire-wound transformer. Similarly, in the power receiving device, when a sufficient step-down ratio is not obtained by a piezoelectric transformer alone, or when a sufficient step-down ratio is not obtained by a wire-wound transformer alone, the wire-wound transformer may be configured to further step-down a voltage which has been stepped-down by the piezoelectric transformer. Through such combination, impedance matching can be realized between a high-impedance capacitive coupling portion and a low-impedance high-frequency voltage generating circuit, or between a high-impedance capacitive coupling portion and a low-impedance load.

REFERENCE SIGNS LIST

C1, C2 . . . capacitors
C10, C11, C12 . . . capacitors
C20, C21, C22 . . . capacitors
Co . . . capacitor
E11, E12 . . . primary side electrodes
E20 . . . secondary side electrode
L1 . . . inductor
L11 . . . inductor
L2 . . . inductor
L21 . . . inductor
RL . . . load
T1 . . . wire-wound transformer
T11 . . . ideal transformer
T2 . . . wire-wound transformer
T21 . . . ideal transformer
1 . . . high-frequency high-voltage generating circuit
2 . . . power transmitting device side passive electrode
3 . . . power transmitting device side active electrode
5 . . . load circuit
6 . . . power receiving device side active electrode
7 . . . power receiving device side passive electrode
11 . . . high-frequency voltage generator
21, 22 . . . piezoelectric resonators
31, 32 . . . piezoelectric transformers
101, 102, 103 . . . power transmitting devices
201, 202, 203 . . . power receiving devices
301, 302, 303 . . . power transmission systems

The invention claimed is:

1. A power transmitting device comprising:
a power transmitting device side active electrode;
a power transmitting device side passive electrode;
a high-frequency voltage generating circuit connected between the power transmitting device side active electrode and the power transmitting side passive electrode; and
an inductor connected between the power transmitting device side active electrode and the high-frequency voltage generating circuit,
wherein the inductor forms a LC resonant circuit with a capacitor having a capacitance corresponding to a capacitance generated between the power transmitting device side active electrode and the power transmitting side passive electrode,
wherein a resonant frequency of the LC resonant circuit is a frequency of a voltage generated by the high-frequency voltage generating circuit, and
wherein the inductor is a piezoelectric device.

2. The power transmitting device according to claim 1, wherein the piezoelectric device is a piezoelectric resonator or a piezoelectric transformer.

3. The power transmitting device according to claim 1, wherein the step-up circuit includes a voltage transforming circuit.

4. The power transmitting device according to claim 1, wherein a frequency generated in the high-frequency voltage generating circuit is a frequency in a range between configured to tune a resonant frequency of the piezoelectric device and an anti-resonant frequency of the piezoelectric device.

5. A power receiving device comprising:
a power receiving device side active electrode;
a power receiving device side passive electrode;
a load circuit connected between the power receiving device side active electrode and the power receiving side passive electrode; and
an inductor connected between the power receiving device side active electrode and the load circuit,
wherein the inductor forms a LC resonant circuit with a capacitor having a capacitance corresponding to a capacitance generated between the power receiving device side active electrode and the power receiving side passive electrode,
wherein a resonant frequency of the LC resonant circuit is a frequency of a voltage generated between the power receiving device side active electrode and the power receiving side passive electrode, and
wherein the inductor is a piezoelectric device.

6. The power receiving device according to claim 5, wherein the piezoelectric device is a piezoelectric resonator or a piezoelectric transformer.

7. The power receiving device according to claim 5, wherein the step-down circuit includes a voltage transforming circuit.

8. A power transmission system comprising:
a power transmitting device according to claim 1; and
a power receiving device including:
a power receiving device side active electrode;
a power receiving device side passive electrode; and
a load circuit connected between the power receiving device side active electrode and the power receiving side passive electrode.

9. A power transmission system comprising:
a power transmitting device including:
a power transmitting device side active electrode;
a power transmitting device side passive electrode; and
a high-frequency voltage generating circuit connected between the power transmitting device side active electrode and the power transmitting side passive electrode; and
receiving device according to claim 5.

* * * * *